(12) United States Patent
Sun et al.

(10) Patent No.: US 10,777,650 B2
(45) Date of Patent: Sep. 15, 2020

(54) HORIZONTAL GATE ALL AROUND DEVICE NANOWIRE AIR GAP SPACER FORMATION

(71) Applicant: Applied Materials, Inc., Santa Clara, CA (US)

(72) Inventors: Shiyu Sun, Santa Clara, CA (US); Nam Sung Kim, Sunnyvale, CA (US); Bingxi Sun Wood, Cupertino, CA (US); Naomi Yoshida, Sunnyvale, CA (US); Sheng-Chin Kung, Milpitas, CA (US); Miao Jin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/494,981

(22) Filed: Apr. 24, 2017

(65) Prior Publication Data

US 2017/0309719 A1    Oct. 26, 2017

Related U.S. Application Data

(60) Provisional application No. 62/344,859, filed on Jun. 2, 2016, provisional application No. 62/327,142, filed on Apr. 25, 2016.

(51) Int. Cl.
*H01L 27/12* (2006.01)
*H01L 29/423* (2006.01)
(Continued)

(52) U.S. Cl.
CPC .. *H01L 29/42392* (2013.01); *H01L 21/02603* (2013.01); *H01L 29/0653* (2013.01);
(Continued)

(58) Field of Classification Search
CPC ............. H01L 29/775; H01L 29/66439; H01L 21/02603; H01L 29/78696;
(Continued)

(56) References Cited

U.S. PATENT DOCUMENTS

| 6,051,861 A | 4/2000 | Togo |
|---|---|---|
| 6,693,335 B2 | 2/2004 | Gonzalez et al. |

(Continued)

FOREIGN PATENT DOCUMENTS

| JP | 2004128508 A | 4/2004 |
|---|---|---|
| JP | 2006080519 A | 3/2006 |
| JP | 2014158050 A | 8/2014 |

OTHER PUBLICATIONS

PCT International Search Report and Written Opinion dated Jul. 4, 2017, for International Application No. PCT/US2017/023413.

(Continued)

*Primary Examiner* — Allen L Parker
*Assistant Examiner* — Wasiul Haider
(74) *Attorney, Agent, or Firm* — Patterson + Sheridan, LLP

(57) ABSTRACT

The present disclosure provides an apparatus and methods for forming nanowire structures with desired materials horizontal gate-all-around (hGAA) structures field effect transistor (FET) for semiconductor chips. In one example, a method of forming nanowire structures includes depositing a dielectric material on a first side and a second side of a stack. The stack may include repeating pairs of a first layer and a second layer. The first side is opposite the second side and the first side and the second side have one or more recesses formed therein. The method includes removing the dielectric material from the first side and the second side of the stack. The dielectric material remains in the one or more recesses. The method includes the deposition of a stressor layer and the formation of one or more side gaps between the stressor layer and the first side and the second side of the stack.

20 Claims, 7 Drawing Sheets

(51) Int. Cl.
- *H01L 29/78* (2006.01)
- *H01L 21/02* (2006.01)
- *H01L 29/775* (2006.01)
- *H01L 29/786* (2006.01)
- *H01L 29/06* (2006.01)
- *H01L 29/66* (2006.01)

(52) U.S. Cl.
CPC ...... *H01L 29/66439* (2013.01); *H01L 29/775* (2013.01); *H01L 29/7848* (2013.01); *H01L 29/78684* (2013.01); *H01L 29/78696* (2013.01); *H01L 29/0673* (2013.01)

(58) Field of Classification Search
CPC ......... H01L 29/42392; H01L 29/78684; H01L 29/66545; H01L 29/66795; H01L 21/28264; H01L 21/285; H01L 29/0653; H01L 29/0673

See application file for complete search history.

(56) References Cited

U.S. PATENT DOCUMENTS

| | | | |
|---|---|---|---|
| 6,833,588 B2 | 12/2004 | Yu et al. | |
| 7,132,342 B1 | 11/2006 | Sadovnikov et al. | |
| 7,838,373 B2 | 11/2010 | Giles et al. | |
| 8,384,069 B2 | 2/2013 | Pernel et al. | |
| 8,637,384 B2 | 1/2014 | Ando et al. | |
| 9,276,064 B1* | 3/2016 | Zang | H01L 29/0673 |
| 2004/0063286 A1 | 4/2004 | Kim et al. | |
| 2010/0025775 A1* | 2/2010 | Giles | H01L 23/485 |
| | | | 257/386 |
| 2012/0007051 A1 | 1/2012 | Bangsaruntip et al. | |
| 2012/0129354 A1* | 5/2012 | Luong | H01L 21/6831 |
| | | | 438/714 |
| 2013/0248950 A1 | 9/2013 | Kang et al. | |
| 2014/0001441 A1* | 1/2014 | Kim | H01L 29/0673 |
| | | | 257/29 |
| 2014/0138779 A1* | 5/2014 | Xie | H01L 29/66545 |
| | | | 257/401 |
| 2014/0264276 A1 | 9/2014 | Chang et al. | |
| 2014/0339507 A1* | 11/2014 | Leobandung | H01L 29/78609 |
| | | | 257/29 |
| 2015/0090958 A1 | 4/2015 | Yang et al. | |
| 2015/0263088 A1* | 9/2015 | Cheng | H01L 29/0673 |
| | | | 257/20 |
| 2015/0333162 A1 | 11/2015 | Bouche et al. | |
| 2015/0372097 A1 | 12/2015 | Bao et al. | |
| 2015/0372115 A1* | 12/2015 | Koh | H01L 29/6656 |
| | | | 438/301 |
| 2015/0372119 A1* | 12/2015 | Zhang | B82Y 10/00 |
| | | | 438/268 |
| 2016/0027870 A1* | 1/2016 | Cheng | H01L 29/0673 |
| | | | 257/347 |
| 2016/0043225 A1 | 2/2016 | Ching et al. | |
| 2017/0069763 A1* | 3/2017 | Doris | H01L 29/66795 |
| 2017/0110567 A1 | 4/2017 | Chen et al. | |
| 2017/0194430 A1 | 7/2017 | Wood et al. | |

OTHER PUBLICATIONS

Korean Office Action dated Dec. 19, 2019 for Application No. 10-2018-7034041.
Japan Office Action dated Feb. 18, 2020 for Application No. 2018-555683.
European Search Report dated Nov. 27, 2019 for Application No. 17790053.7.
Written Opinion and International Search Report from PCT/US2016/069272 dated Apr. 17, 2017.
Korean Office Action dated May 28, 2020 for Application No. 10-2018-7034041.
Korean Office Action dated Jul. 22, 2020 for Application No. 10-2018-7034041 6 pages.

* cited by examiner

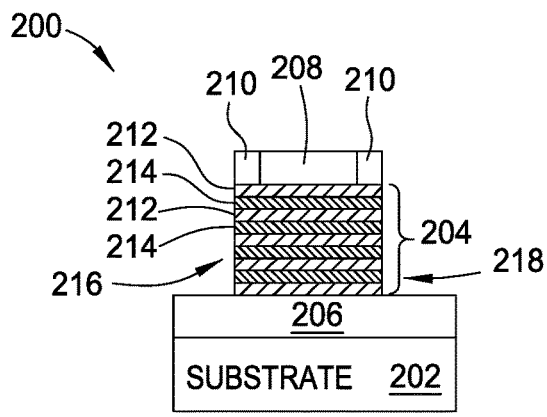
FIG. 2A
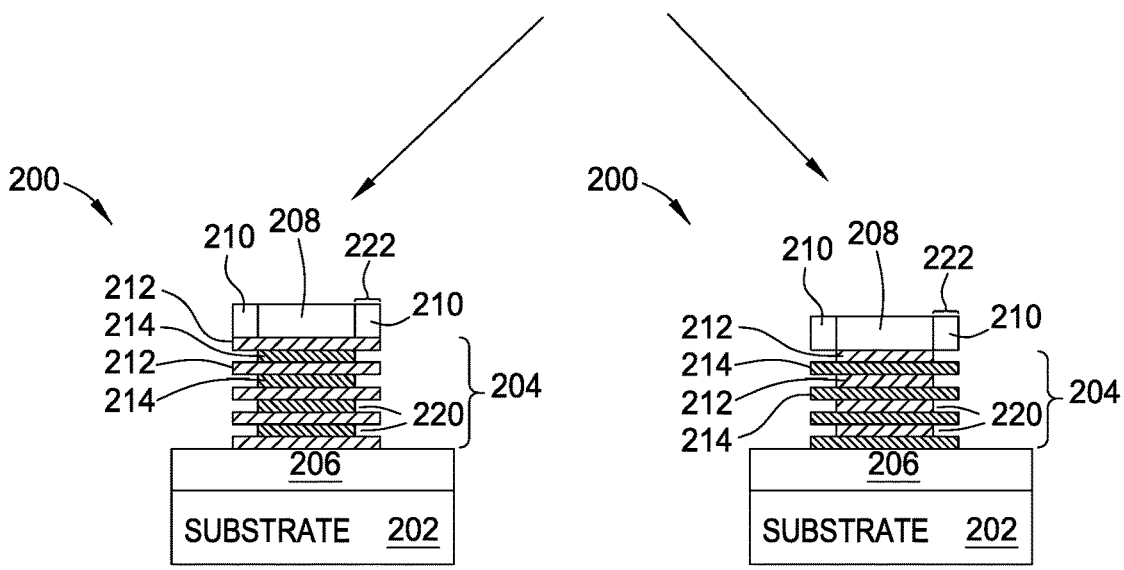
FIG. 2B1  FIG. 2B2
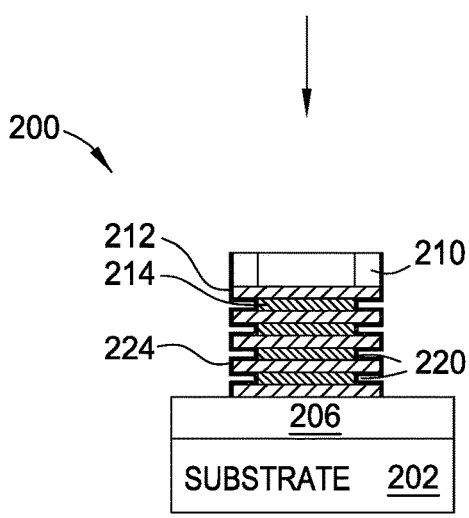 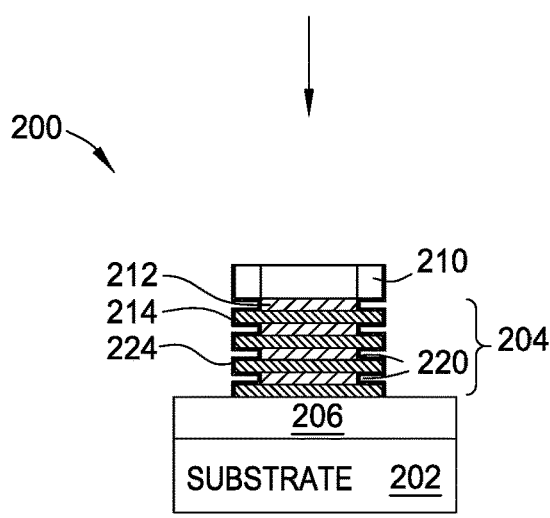
FIG. 2C1  FIG. 2C2

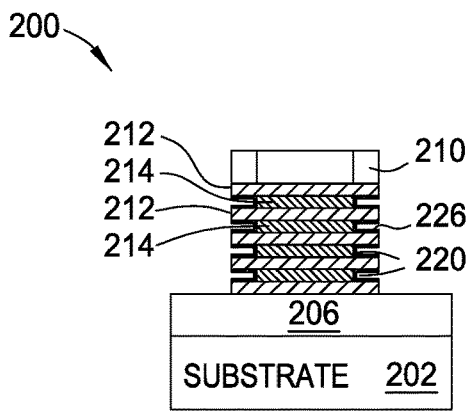
FIG. 2D1
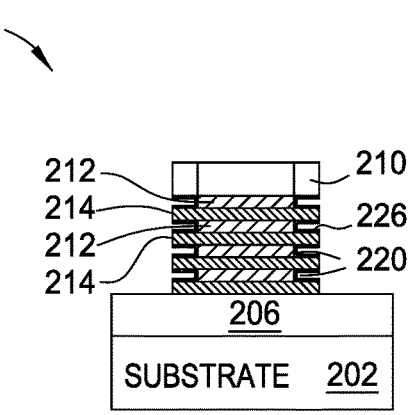
FIG. 2D2
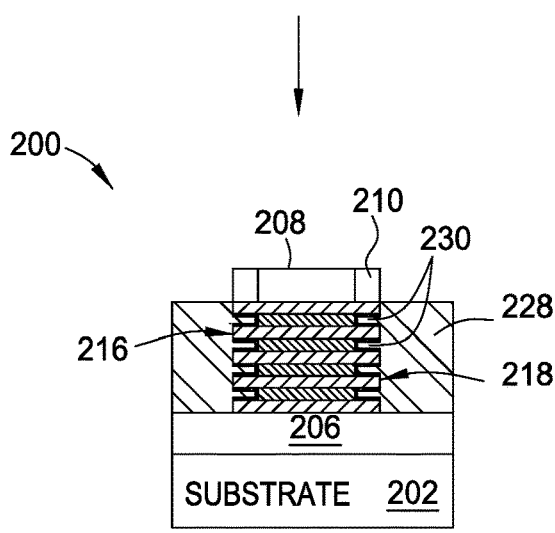
FIG. 2E1
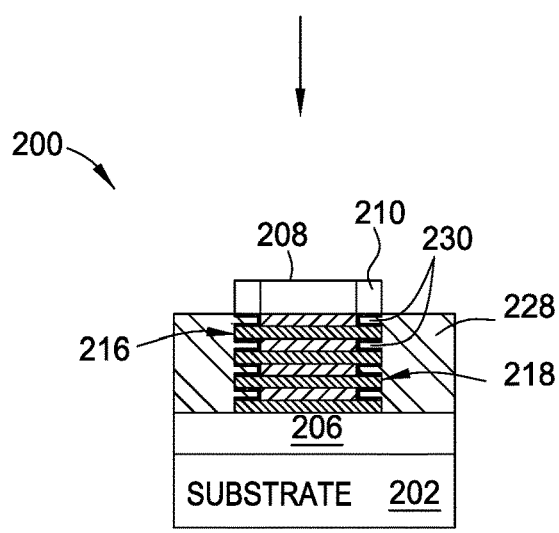
FIG. 2E2
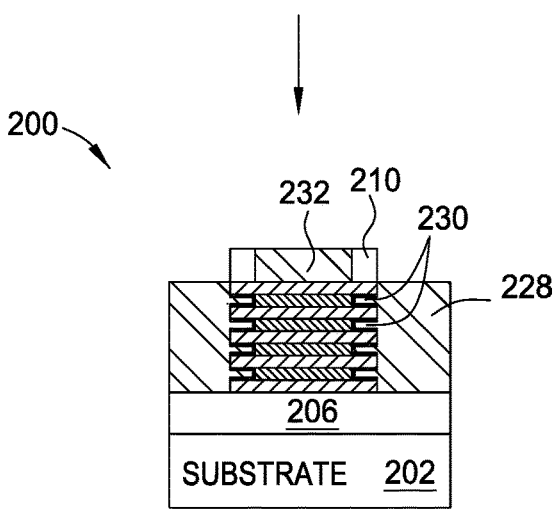
FIG. 2F1
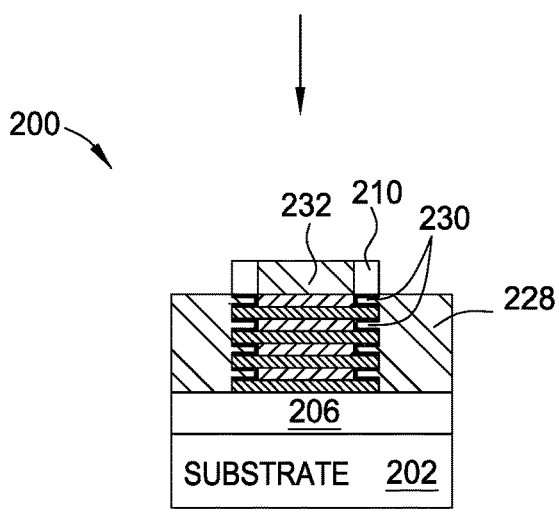
FIG. 2F2

HORIZONTAL GATE ALL AROUND DEVICE NANOWIRE AIR GAP SPACER FORMATION

CROSS-REFERENCE TO RELATED APPLICATIONS

This application claims benefit of U.S. provisional patent application Ser. No. 62/327,142, filed Apr. 25, 2016, and U.S. provisional patent application Ser. No. 62/344,859, filed Jun. 2, 2016, which is herein incorporated by reference.

BACKGROUND OF THE DISCLOSURE

Field of the Disclosure

Embodiments of the present disclosure generally relate to stacked hGAA devices.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 25 nm and 20 nm dimensions and beyond, whereas the thickness of the dielectric layers remain substantially constant, with the result of increasing the aspect ratios of the features. Furthermore, reduced channel length often causes significant short channel effect with conventional planar MOSFET architecture. In order to enable fabrication of next generation devices and structures, three dimensional (3D) device structure is often utilized to improve performance of the transistors. In particular, fin field effect transistors (FinFET) are often utilized to enhance device performance. FinFET devices typically include semiconductor fins with high aspect ratios in which the channel and source/drain regions for the transistor are formed thereover. A gate electrode is then formed over and along side of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow. Device structures with horizontal gate-all-around (hGAA) configurations often provide superior electrostatic control by surrounding gate to suppress short channel effect and associated leakage current.

In some applications, hGAA structures are utilized for next generation semiconductor device applications. The hGAA device structure includes several lattice matched channels (e.g., nanowires) suspended in a stacked configuration and connected by source/drain regions.

In hGAA structures, different materials are often utilized to form the channel structures (e.g., nanowires), which may undesirably increase the manufacturing difficulty in integrating all these materials in the nanowire structures without deteriorating the device performance. For example, one of the challenges associated with hGAA structures include the existence of large parasitic capacitance between the metal gate and source/drain. Improper management of such parasitic capacitance may result in much degraded device performance.

Thus, there is a need for an improved structures and method of fabricating an hGAA device.

SUMMARY OF THE DISCLOSURE

The present disclosure provides structures and methods for forming nanowire structures with desired materials horizontal gate-all-around (hGAA) structures for semiconductor chips.

In one embodiment, a method of processing a substrate is disclosed. The method includes depositing a dielectric material on each of a first side of a stack and a second side of the stack. The stack includes repeating pairs of a first layer and a second layer. The first side of the stack is opposite the second side of the stack, and each of the first side and the second side includes one or more recesses. The method also includes removing the dielectric material from the first side of the stack and the second side of the stack. The dielectric material remains in the one or more recesses of the first side and the second side. The method also includes depositing a stressor layer adjacent to the first side and the second side and forming one or more gaps between the stressor layer and the first side and the second side of the stack.

In another embodiment, another method of processing a substrate is disclosed. The method includes depositing a stack on the substrate in a process chamber. The stack includes repeating pairs of a first layer and a second layer. The method also includes removing material from the stack to create one or more recesses on each of a first side of the stack and a second side of the stack opposite from the first side. The method also includes depositing a dielectric material on the first side of a stack, the second side of the stack, and within the one or more recesses. The method also includes removing the dielectric material from each of the first side and the second side. The dielectric material remains in the one or more recesses. The method also includes depositing a stressor layer adjacent the first side and the second side and forming one or more gaps between the stressor layer and the first side and between the stressor layer and the second side of the stack.

In yet another embodiment, a nanowire structure is disclosed. The nanowire structure includes a stack with repeating pairs of a first layer and a second layer. The stack also includes a first side opposite a second side. The nanowire structure also includes, a gate structure surrounding the stack, a source layer adjacent to the first side of the stack, a drain layer opposite the source layer and adjacent the second side of the stack, one or more gaps disposed between the source layer and the second layer, and one or more gaps disposed between the drain layer and the second layer.

DETAILED DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 depicts a flow diagram of a method for manufacturing nanowire structures formed on a substrate.

FIGS. 2A, 2B1, 2C1, 2D1, 2E1, and 2F1 depict cross sectional views of one example of a sequence for forming a nanowire structure with desired materials during the manufacturing process of FIG. 1.

FIGS. 2A, 2B2, 2C2, 2D2, 2E2, and 2F2 depict cross sectional views of another example of a sequence for forming a nanowire structure with desired materials during the manufacturing process of FIG. 1.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure provides an apparatus and methods for forming nanowire structures with desired materials horizontal gate-all-around (hGAA) structures field effect transistor (FET) for semiconductor chips. In one example, a method of forming nanowire structures includes depositing a dielectric material on a first side and a second side of a stack. The stack may include repeating pairs of a first layer and a second layer. The first side is opposite the second side and the first side and the second side have one or more recesses formed therein. The method includes removing the dielectric material from the first side and the second side of the stack. The dielectric material remains in the one or more recesses. The method includes the deposition of a stressor layer and the formation of one or more side gaps between the stressor layer and the first side and the second side of the stack. A nanowire structures with controlled parasitic capacitance for a horizontal gate-all-around (hGAA) semiconductor device structure is provided.

Figure 1:
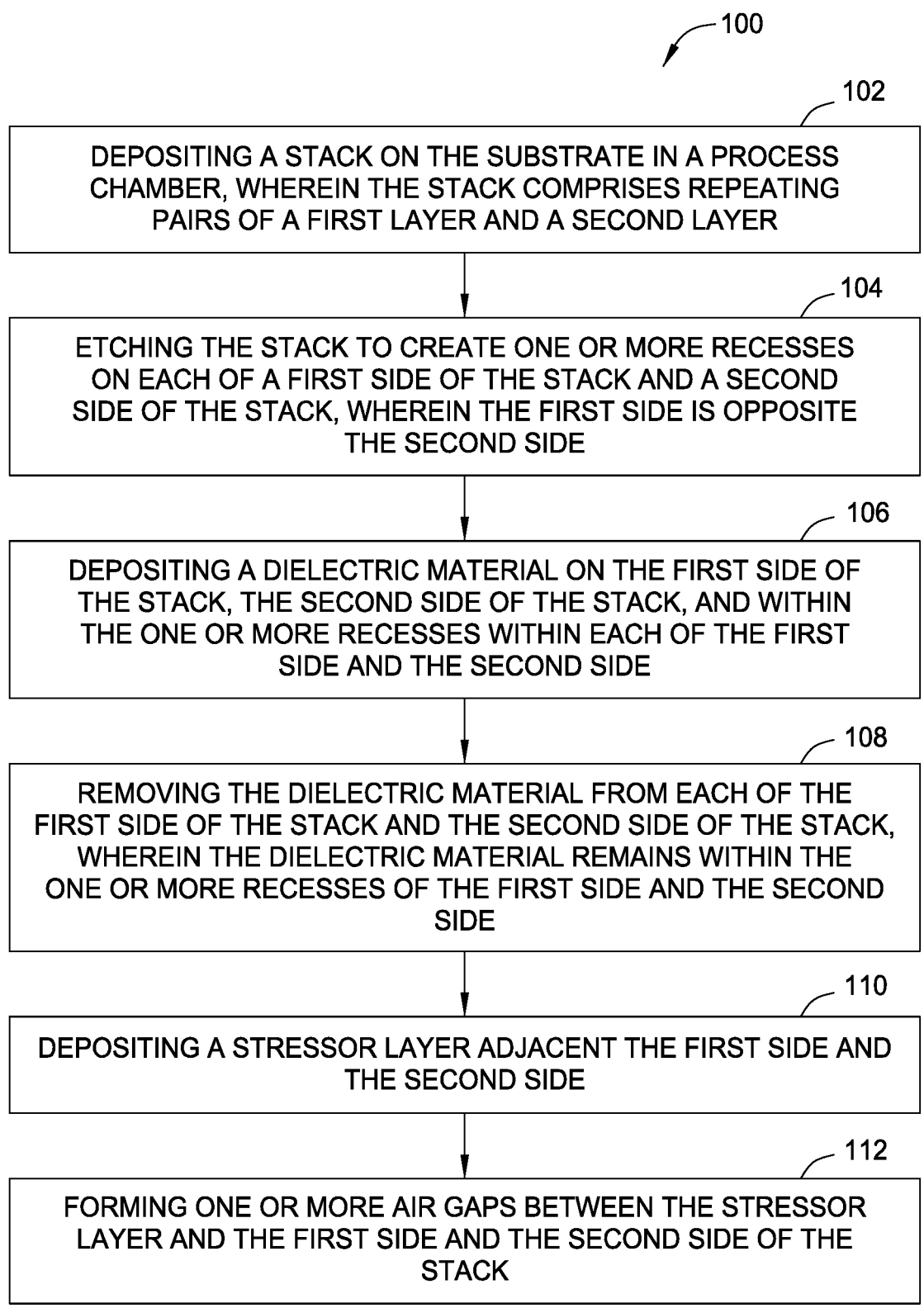

FIG. 1 is a flow diagram of one example of a method 100 for manufacturing nanowire structures (e.g., channel structures) with composite materials for horizontal gate-all-around (hGAA) semiconductor device structures. FIGS. 2A-2C are cross-sectional views of a portion of a composite substrate corresponding to various stages of the method 100. The method 100 may be utilized to form the nanowire structure for horizontal gate-all-around (hGAA) semiconductor device 200 structures on a substrate having desired materials which may later be utilized to form a field effect transistor (FET). Alternatively, the method 100 may be beneficially utilized to manufacture other types of structures.

Figure 4:
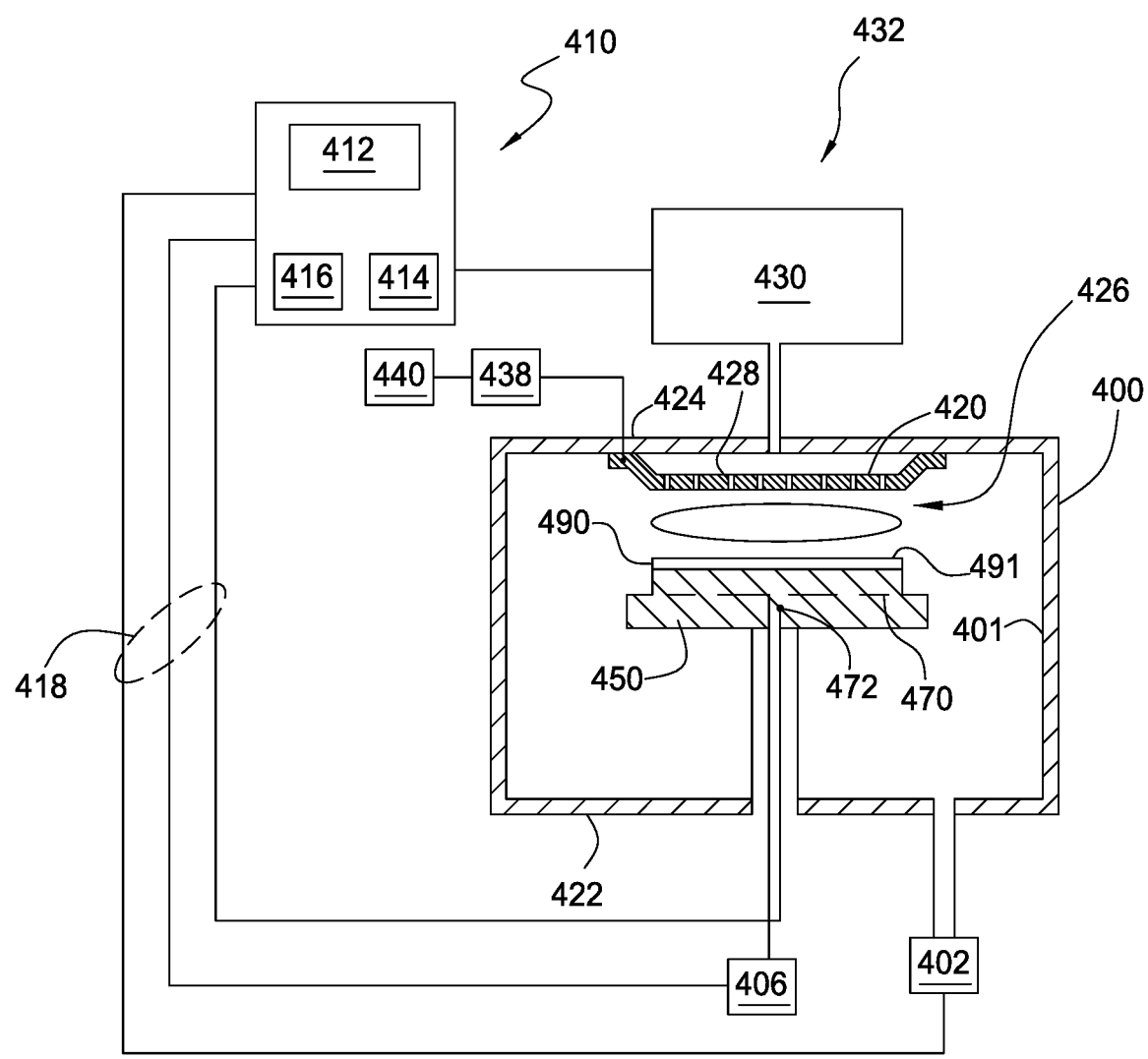
FIG. 4 depicts a plasma processing chamber which may be utilized to perform a deposition process on a substrate.

The method 100 begins at operation 102 by depositing a film stack 204, as shown in FIG. 2A, on a substrate 202 in a process chamber, such as the chamber 400 depicted in FIG. 4. The substrate 202 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 202 may have various dimensions, such as 200 mm, 300 mm, 450 mm or other diameter, as well as, being a rectangular or square panel.

The film stack 204 may be disposed on an optional material layer 206. In the embodiments wherein the optional material layer 206 is not present, the film stack 204 may be directly formed on the substrate 202 as needed. In one example, the optional material layer 206 is an insulating material. Suitable examples of the insulating material may include silicon oxide material, silicon nitride material, silicon oxynitride material, or any suitable insulating materials. Alternatively, the optional material layer 206 may be any suitable materials including conductive material or non-conductive material as needed. The stack 204 includes at least one pair of layers, each pair comprising a first layer 212 and a second layer 214. Although the example depicted in FIG. 2A shows four pairs, each pair including the first layer 212 and the second layer 214 (alternating pairs, each pair comprising the first layer 212 and the second layer 214), it is noted that number of pairs, each comprising a first layer 212 and a second layer 214, may be varied based on different process needs. In one particular embodiment, 4 pairs of the first and second layers, 212, 214 may be deposited to form the stack 204 on the substrate 202. In one implementation, the thickness of each single first layer 212 may be at between about 20 Å and about 200 Å, such as about 50 Å, and the thickness of the each single second layer 214 may be at between about 20 Å and about 200 Å, such as about 50 Å.

The first layer 212 may be a crystalline silicon layer, such as a single crystalline, polycrystalline, or monocrystalline silicon layer, formed by an epitaxial deposition process. Alternatively, the first layer 212 may be a doped silicon layer, including a p-type doped silicon layer or a n-type doped layer. Suitable p-type dopant includes B dopants, Al dopants, Ga dopants, In dopants, or the like. Suitable n-type dopant includes N dopants, P dopants, As dopants, Sb dopants, or the like. In yet another example, the first layer 212 is a group III-V material, such as a GaAs layer.

The second layer 214 may be a Ge containing layer, such as a SiGe layer, Ge layer, or other suitable layer. Alternatively, the second layer 214 may be a doped silicon layer, including a p-type doped silicon layer or a n-type doped layer. In yet another example, the second layer 214 may be a group III-V material, such as a GaAs layer. In still another example, the first layer 212 may be a silicon layer and the second layer 214 is a metal material having a high-k material coating on outer surfaces of the metal material. Suitable examples of the high-k material includes hafnium dioxide (HfO2), zirconium dioxide (ZrO2), hafnium silicate oxide (HfSiO4), hafnium aluminum oxide (HfAlO), zirconium silicate oxide (ZrSiO4), tantalum dioxide (TaO2), aluminum oxide, aluminum doped hafnium dioxide, bismuth strontium titanium (BST), or platinum zirconium titanium (PZT), among others. In one particular implementation the coating layer is a hafnium dioxide (HfO2) layer. It is noted that the selection of the substrate materials along with the first layer 212 and the second layer 214 in the stack 204 may be in different combinations utilizing the materials listed above.

In the particular example depicted in FIG. 2A, the first layer 212 is a crystalline silicon layer, such as a single crystalline, polycrystalline, or monocrystalline silicon layer.

The second layer 214 is a SiGe layer. A dummy gate 208 and gate spacer 210 may be deposited on top of the stack 204. In some examples, a hardmask layer (not shown in FIG. 2A) and/or a patterned photoresist layer may be disposed on the dummy gate 208, the gate spacer 210, and the stack 204 for patterning. In the example shown in FIG. 2A, the dummy gate 208, the gate spacer 210, and the stack 204 has been patterned in the previous patterning processes to expose a first side 216 of the stack 204 and to expose a second side 218 of the stack 204, which may later have source/drain anchors formed adjacent thereto. The first side 216 is opposite the second side 218 and orthogonal the substrate 202.

At operation 104, the stack 204 is etched to remove some material and create one or more recesses 220 on each of the first side 216 of the stack 204 and the second side 218 of the stack 204, as shown in FIGS. 2B1 and 2B2. In one embodiment, the recesses 220 are selectively formed within the second layer 214 of the stack 204, as shown in FIG. 2B1. In another embodiment, the recesses 220 are selectively formed within the first layer 212 of the stack 204, as shown in FIG. 2B2. The depth of the recesses is about the width 222 of the gate spacer 210. In one embodiment, a plasma including fluorine ions and radicals within a process chamber, such as the chamber 400 of FIG. 4, are used to selectively etch the one or more recesses 220. A plasma including fluorine ions and radicals and oxygen ions and radicals within a process chamber may be used to selectively etch the one or more recesses 220. Nitrogen ions and radicals may also be included. A fluorocarbon precursor may be flowed at a rate between about 300 sccm and 500 sccm. The oxygen radicals may be used to control the etch rate of the second layer 214 of the stack 204. In another embodiment, the oxygen radicals and nitrogen radicals are used to control the etch rate of the first layer 212 of the stack 204. The oxygen ions and radicals may be flowed at a rate between about 10 sccm to 40 sccm. The nitrogen ions and radicals may be flowed at a rate between about 10 sccm to 40 sccm.

At operation 106 a dielectric layer 224 may be deposited on sidewalls 216, 218 of the stack 204 and within each the one or more recesses 220 of each of the first side 216 and the second side 218 of the stack 204, as shown in FIGS. 2C1 and 2C2. The dielectric layer 224 may also be deposited on the gate spacer 210. The dielectric layer 224 may provide a shield within the recesses 220 preventing epitaxial growth as described below. The dielectric layer 224 lines the inner surfaces of the recesses 220 while maintaining an air pocket within the recesses 220. In one embodiment, the dielectric layer 224 lines the inner surfaces of the recesses 220 formed within the second layer 214 while maintaining an air pocket within the recesses 220, as shown in FIG. 2C1. In another embodiment, the dielectric layer 224 lines the inner surfaces of the recesses 220 formed within the first layer 212 while maintaining an air pocket within the recesses 220, as shown in FIG. 2C2. The dielectric layer 224 may be selected from a material that may prevent deposition during epitaxial growth. In one embodiment, the dielectric layer 224 is a silicon containing dielectric layer, such as a silicon nitride containing layer, a silicon carbide containing layer, silicon oxygen containing layer, for example, silicon oxide, silicon nitride (SiN), silicon oxynitride (SiON), silicon carbide (SiC), silicon carbonitride (SiCN), silicon oxycarbide (SiOC) or silicon oxycarbonitride or silicon materials with dopants and the like. Dopants formed in the silicon containing dielectric layer may have relatively low concentration. The dielectric layer may also contain silicon rich film properties. In one example, the dielectric layer 224 is a silicon nitride layer or a silicon oxynitride (SiON) with a thickness between about 5 Å and about 50 Å, such as about 10 Å. The dielectric layer 224 may be formed by a CVD process, an ALD process or any suitable deposition techniques in a PVD, CVD, ALD, or other suitable plasma processing chambers.

At operation 108, after the dielectric layer 224 is formed on the sidewalls 216, 218 of the stack 204 and within recesses 220, the dielectric material from each of the first side 216 of the stack 204 and the second side 218 of the stack 204 is selectively removed, as seen in FIGS. 2D1 and 2D2. The dielectric material 226 remains within the recesses 220 of the first side 216 and the second side 218. In other words, the dielectric material 226 covers the inner walls of the recesses 220. In one embodiment, the dielectric material 226 covers the inner walls of the recesses 220 formed within the second layer 214, as shown in FIG. 2D1. In another embodiment, the dielectric material 226 covers the inner walls of the recesses 220 formed within the first layer 212, as shown in FIG. 2D2. The dielectric material 224 is also removed from the gate spacer 210. By selectively removing the dielectric material 224 from the sidewalls 216, 218 and maintaining the dielectric material 226 within the recesses 220, the inside walls of the recesses are advantageously shielded from epitaxial growth in the subsequent steps.

At operation 110, a selective deposition may be performed to deposit a stressor layer 228 adjacent the first side 216 and the second side 218, as seen in FIG. 2E1 and FIG. 2E2. The stressor layer 228 is selectively deposited on certain regions not protected by the dielectric material 226. The stressor layer 228 may selectively be patterned to remove a portion adjacent the gate spacer 210. The stressor layer 228 may later become the source/drain of the gate all-around transistor. At operation 112, one or more air gaps 230 are formed between the stressor layer 228 and the first side 216 and the second side 218 of the stack 204, as seen in FIGS. 2E1 and 2E2. In one embodiment, the selective deposition of the stressor layer 228 forms the air gaps 230 on the edges of the second layer 214. In other words, the air gaps 230 are formed between the second layer 214 and the stressor layer 228, as seen in FIGS. 2E1-2F1. In another embodiment, the selective deposition of the stressor layer 228 forms the air gaps 230 on the edges of the first layer 212, as seen in FIGS. 2E2-2F2. In other words, the air gaps 230 are formed between the first layer 212 and the stressor layer 228. In one embodiment, the air in the air gaps 230 contains oxygen. It can be imagined that the air in the air gaps 230 may contain at least one of hydrogen, oxygen, argon, nitrogen, helium, or a mixture thereof. As seen in FIGS. 2E1 and 2E2, the horizontal gate-all-around semiconductor device 200 may include one or more air gaps disposed between the second layer 214 or the first layer 212 of the stack 204 and the stressor layer 228 which may become the source or drain. In one embodiment, the dummy gate 208 is subsequently replaced by a replacement metal gate (RMG) 232, as seen in FIGS. 2F1 and 2F2. In another embodiment, not shown, both the dummy gate 208 and the second layer 214 are etched and replaced by replacement metal gates. In other words, the dummy gate 208 may be replaced by metal gate 232 and the second layer 214 may be replaced by another metal gate (not shown).

Capacitance is directly related to the dielectric constant of the materials used. Air gaps have the lowest dielectric constant, k, as compared to oxidized material or spacer materials. Thus, utilizing a method with the lowest dielectric constant, the parasitic capacitance between the gate and source/drain can be advantageously limited as well. The above method advantageously utilizes air gaps with a k value around 1 to limit the parasitic capacitance in horizontal gate-all-around structures.

In one implementation, the selective deposition process may be performed in a suitable plasma processing chamber, including the processing chambers, such as the processing chamber 400 depicted in FIG. 4 or other suitable plasma chamber. The processing temperature is controlled at a low temperature range, such as less than 1200 degrees Celsius. In one implementation, the deposition process may be performed in a plasma containing environment, a thermal environment (such as furnace) or thermal plasma environment (such as plasma enhanced chemical vapor deposition process (PECVD), low pressure chemical vapor deposition process (LPCVD), sub-atmospheric chemical vapor deposition process (SACVD), atmospheric chemical vapor deposition process (APCVD)).

After the one or more air gaps 230 are formed in the film stack 204, the stack 204 may be utilized as nanowires in a horizontal gate-all-around structure with reduced parasitic capacitance and minimum device leakage.

Figure 3A:
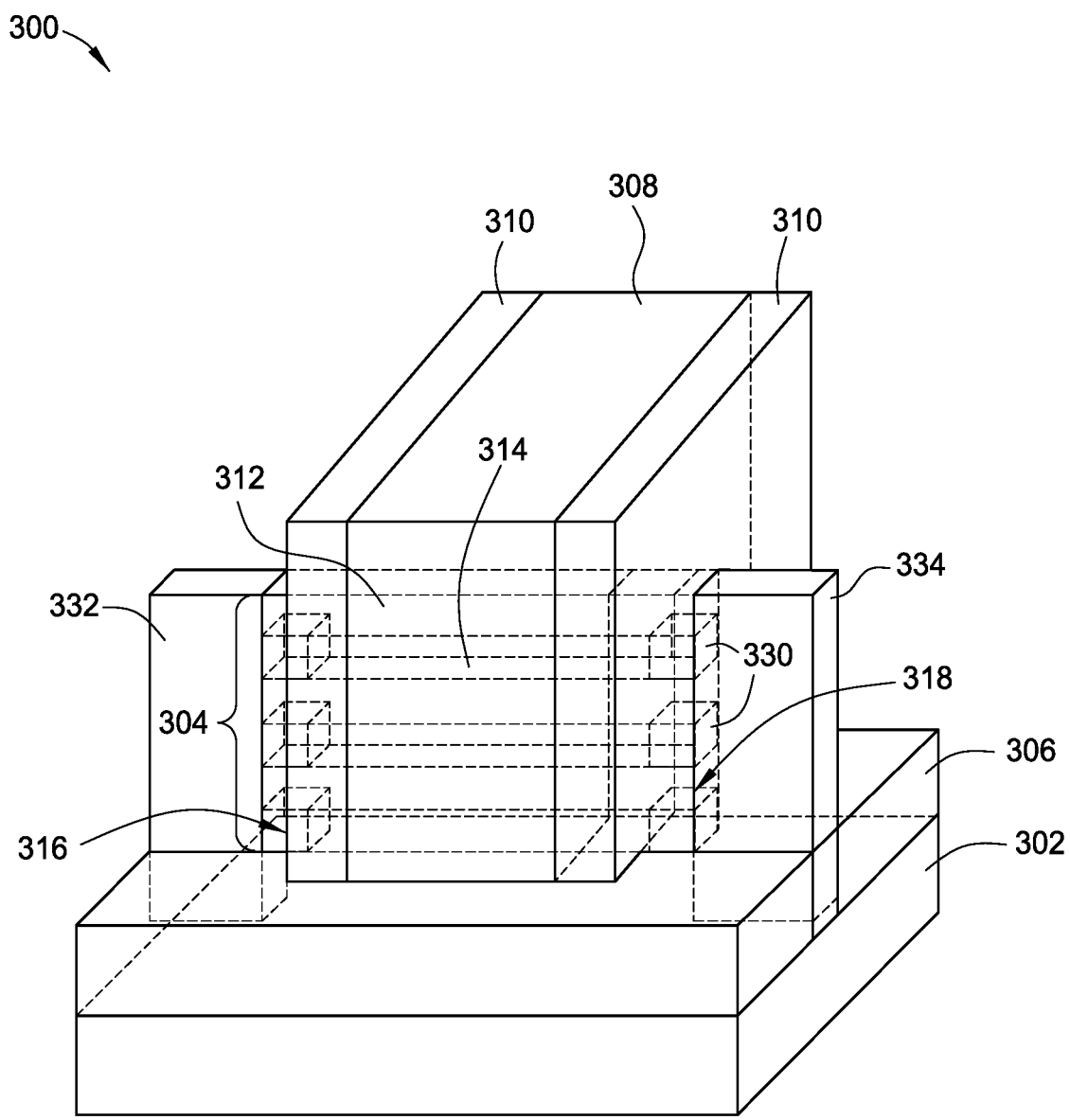
FIGS. 3A-3C depict a schematic view of an example of a horizontal gate-all-around (hGAA) structure.

FIG. 3A shows a horizontal gate-all-around (hGAA) structure 300 according to one embodiment. The hGAA structure 300 may be substantially similar to the hGAA structure 200, shown in FIG. 2E1. In another embodiment, the hGAA structure 300 is substantially similar to the hGAA structure 200, shown in FIG. 2E2. The horizontal gate-all-around structure 300 includes a substrate 302, an optional material layer 306, a source 332, a drain 334, a gate 308, a gate spacer 310, and a stack 304.

The stack 304 may be disposed on the substrate 302. In one embodiment the stack 304 is deposited on the optional material layer 306. The stack 304 has a first side 316 and a second side 318. The first side 316 is opposite the second side 318. The first side 318 is orthogonal to the substrate 302. The stack 304 may include repeating pairs of a first layer 312 and a second layer 314. In one embodiment, the stack 304 contains at least 4 repeating pairs of a first layer 312 and a second layer 314. The stack 304 includes one or more air gaps 330. In one embodiment, the air gaps 330 are disposed at the ends of the second layer 314. In other words, the second layer 314 is between two end cap air gaps 330. In another embodiment, the air gaps 330 are disposed at the ends of the first layer 312. In other words, the first layer 312 is between two end cap air gaps 330.

The first layer 312 may be a crystalline silicon layer, such as a single crystalline, polycrystalline, or monocrystalline silicon layer, formed by an epitaxial deposition process. Alternatively, the first layer 312 a may be a doped silicon layer, including a p-type doped silicon layer or a n-type doped layer. Suitable p-type dopant includes B dopants, Al dopants, Ga dopants, In dopants, or the like. Suitable n-type dopant includes N dopants, P dopants, As dopants, Sb dopants, or the like. In yet another example, the first layer 312 may be a group III-V material, such as a GaAs layer.

The second layer 314 may be a Ge containing layer, such as a SiGe layer, Ge layer, or other suitable layer. Alternatively, the second layer 314 may be a doped silicon layer, including a p-type doped silicon layer or a n-type doped layer. In yet another example, the second layer 314 may be a group III-V material, such as a GaAs layer. In still another example, the first layer 312 may be a silicon layer and the second layer 314 is a metal material having a high-k material coating on outer surfaces of the metal material. Suitable examples of the high-k material includes hafnium dioxide (HfO2), zirconium dioxide (ZrO2), hafnium silicate oxide (HfSiO4), hafnium aluminum oxide (HfAlO), zirconium silicate oxide (ZrSiO4), tantalum dioxide (TaO2), aluminum oxide, aluminum doped hafnium dioxide, bismuth strontium titanium (BST), or platinum zirconium titanium (PZT), among others. In one particular implementation the coating layer is a hafnium dioxide (HfO2) layer. It is noted that the selection of the substrate materials along with the first layer 312 and the second layer 314 in the stack 304 may be in different combinations utilizing the materials listed above.

The source 332 is disposed adjacent the first side 316 of the stack 304 and orthogonal to the substrate 302. The drain 334 is disposed adjacent the second side 318 of the stack 304 and orthogonal to the substrate 302. The source 332 is opposite the drain 334. In other words, the stack 304 is disposed between the source 332 and the drain 334. In one embodiment, a first set of one or more air gaps 330 are disposed between the source 332 and the stack 304, specifically the second layer 314 of the stack 304. A second set of one or more air gaps 330 are disposed between the drain 334 and the stack 304, specifically the second layer 314 of the stack 304.

The gate 308 is disposed on the stack 304. The gate 308 surrounds the stack 304. In one embodiment the gate 308 is disposed between the spacer 310 on both sides. In other words, the gate spacer 310 may be disposed on either side of the gate 308. The gate spacer 310 may also surround the stack 304. In one embodiment, the gate spacer surrounds and aligns with the air gaps 330 of the stack 304.

Figure 3B:
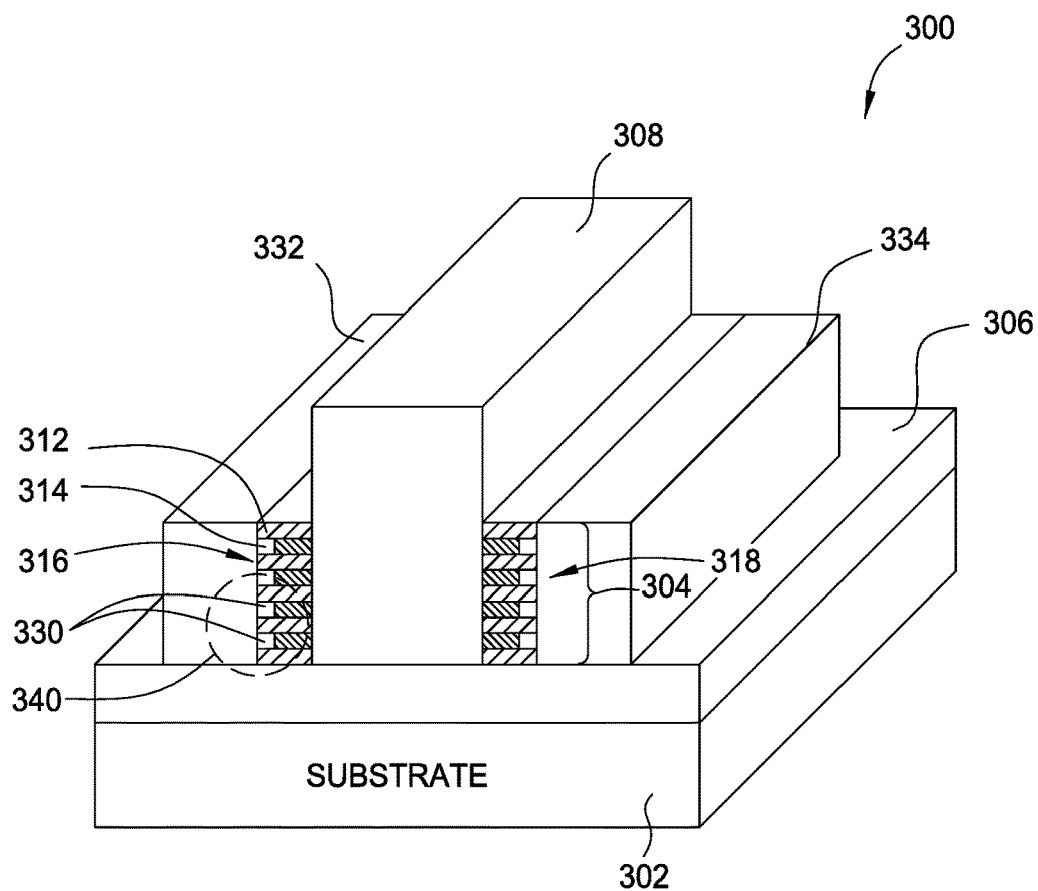
Figure 3C:
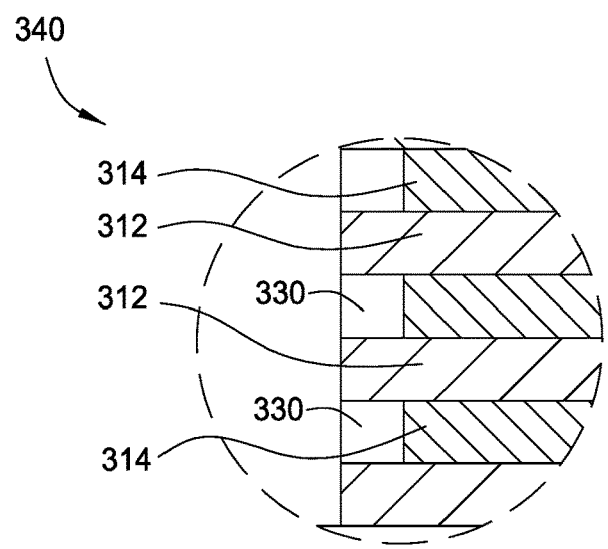

FIG. 3B depicts a cross-section schematic view of the hGAA device 300 without the gate spacer layer. The hGAA device 300 includes pairs of the first layer 312 and the second layer 314 with the air gaps 330 formed therein. The horizontal gate-all-around (hGAA) structure 300 utilizes the stack 304 as nanowires (e.g., channels) between source/drain anchors 332, 334, respectively, and a gate structure 308. As shown in the enlarged view of the stack 304 in FIG. 3C indicated by the circle 340, the air gaps 330 formed at the bottom (e.g., or an end) of the second layer 314 or the first layer 312 may assist managing the interface wherein the second layer 314 or the first layer 312 is in contact with the gate structure 308 and/or the source/drain anchors 332, 334 so as to reduce parasitic capacitance and maintain minimum device leakage.

FIG. 4 is a cross sectional view of an illustrative processing system 432 suitable for performing the selective processes as further described above. The processing system 432 may be an OLYMPIA®, SICONI®, or PRODUCER®, all available from Applied Materials, Inc., Santa Clara, Calif. It is contemplated that other processing system, including those available from other manufacturers, may be adapted to practice the disclosure.

The processing system 432 includes a processing chamber 400 coupled to a gas panel 430 and a controller 410. The processing chamber 400 generally includes a top 424, a side 401 and a bottom wall 422 that define an interior volume 426.

A support pedestal 450 is provided in the interior volume 426 of the chamber 400. The pedestal 450 may be fabricated from aluminum, ceramic, and other suitable materials. The pedestal 450 may include an embedded heater element 470 suitable for controlling the temperature of a substrate 490 supported on the pedestal 450. In one embodiment, the pedestal 450 is resistively heated by applying an electric current from a power supply 406 to the heater element 470. The electric current supplied from the power supply 406 is regulated by the controller 410 to control the heat generated by the heater element 470, thereby maintaining the substrate 490 and the pedestal 450 at a substantially constant temperature during film deposition at any suitable temperature range.

A temperature sensor 472, such as a thermocouple, may be embedded in the support pedestal 450 to monitor the temperature of the pedestal 450 in a conventional manner. The measured temperature is used by the controller 410 to control the power supplied to the heater element 470 to maintain the substrate at a desired temperature.

A vacuum pump 402 is coupled to a port formed in the walls 401 of the chamber 400. The vacuum pump 402 is used to maintain a desired gas pressure in the processing chamber 400. The vacuum pump 402 also evacuates post-processing gases and by-products of the process from the chamber 400.

A showerhead 420 having a plurality of apertures 428 is coupled to the top 424 of the processing chamber 400 above the substrate support pedestal 450. The apertures 428 of the showerhead 420 are utilized to introduce process gases into the chamber 400. The apertures 428 may have different sizes, number, distributions, shape, design, and diameters to facilitate the flow of the various process gases for different process requirements. The showerhead 420 is connected to the gas panel 430 that allows various gases to supply to the interior volume 426 during process. A plasma is formed from the process gas mixture exiting the showerhead 420 to enhance thermal decomposition of the process gases resulting in the deposition of material on a surface 491 of the substrate 490.

One or more RF power sources 440 provide a bias potential through a matching network 438 to the showerhead 420 to facilitate generation of a plasma between the showerhead 420 and the pedestal 450. The controller 410 includes a central processing unit (CPU) 412, a memory 416, and a support circuit 414 utilized to control the process sequence and regulate the gas flows from the gas panel 430 and the WVG system 452. Bi-directional communications between the controller 410 and the various components of the processing system 432 are handled through numerous signal cables collectively referred to as signal buses 418, some of which are illustrated in FIG. 4.

Figure 5:
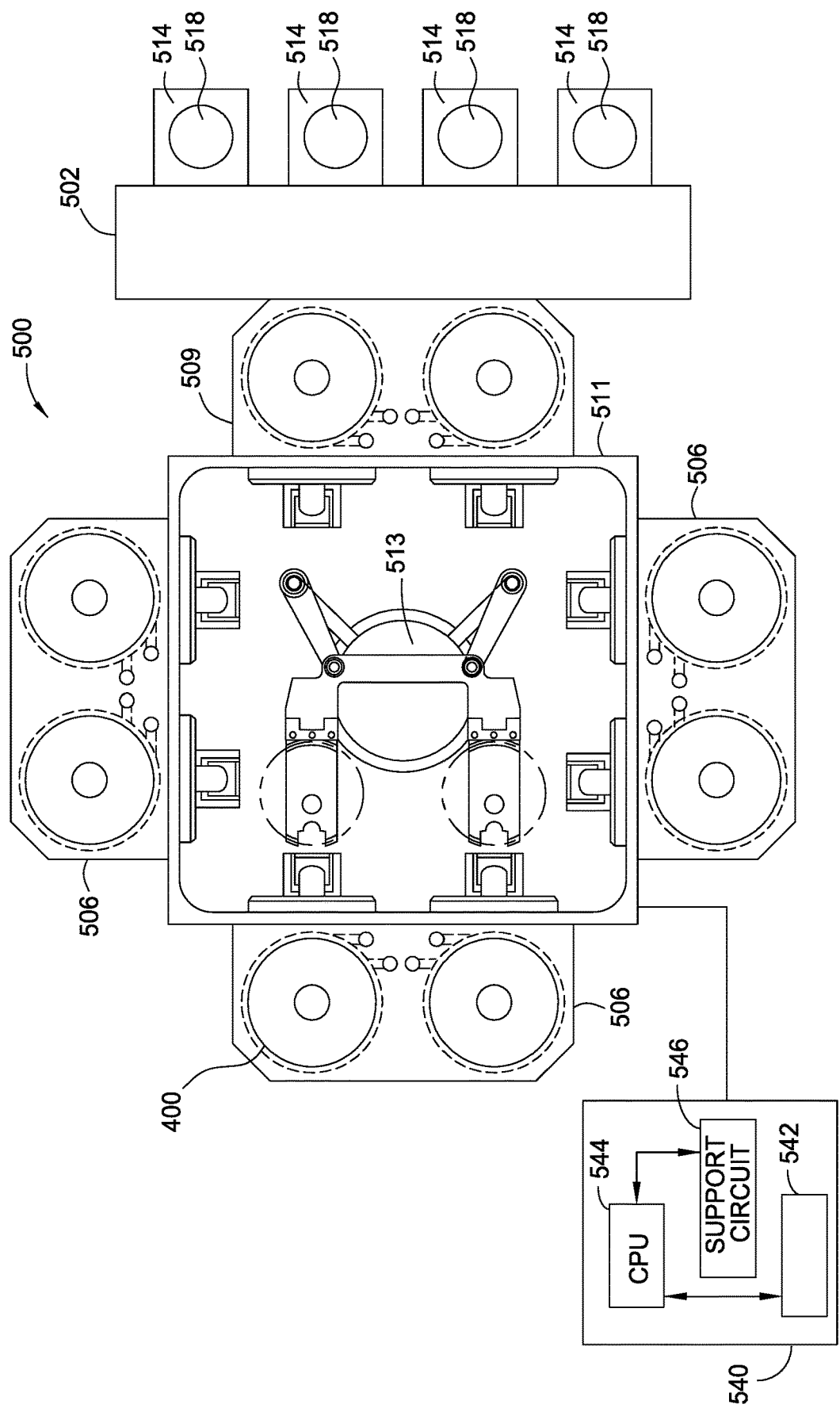
FIG. 5 depicts a processing system that may include plasma processing chambers of FIG. 4 to be incorporated therein.

FIG. 5 depicts a plan view of a semiconductor processing system 500 that the methods described herein may be practiced. One processing system that may be adapted to benefit from the disclosure is a 300 mm PRODUCER® processing system, commercially available from Applied Materials, Inc., of Santa Clara, Calif. The processing system 500 generally includes a front platform 502 where substrate cassettes 518 included in FOUPs 514 are supported and substrates are loaded into and unloaded from a loadlock chamber 509, a transfer chamber 511 housing a substrate handler 513 and a series of tandem processing chambers 506 mounted on the transfer chamber 511.

Each of the tandem processing chambers 506 includes two process regions for processing the substrates. The two process regions share a common supply of gases, common pressure control, and common process gas exhaust/pumping system. Modular design of the system enables rapid conversion from any one configuration to any other. The arrangement and combination of chambers may be altered for purposes of performing specific process steps. Any of the tandem processing chambers 506 can include a lid according to aspects of the disclosure as described below that includes one or more chamber configurations described above with referenced to the processing chamber 400 depicted in FIG. 4. It is noted that the processing chamber 400 may be configured to perform a deposition process, etching process, curing processes, or heating/annealing process as needed. In one embodiment, the processing chamber 400, shown as a single chamber designed, may be incorporated into the semiconductor processing system 500.

In one implementation, the processing system 432 can be adapted with one or more of the tandem processing chambers having supporting chamber hardware known to accommodate various other known processes such as chemical vapor deposition (CVD), physical vapor deposition (PVD), etching, curing, or heating/annealing and the like.

A controller 540, including a central processing unit (CPU) 544, a memory 542, and support circuits 546, is coupled to the various components of the semiconductor processing system 500 to facilitate control of the processes of the present disclosure. A software routine or a series of program instructions stored in the memory 542, when executed by the CPU 544, executes the tandem processing chambers 506.

Thus, methods for forming nanowire structures with reduced parasitic capacitance and minimum device leakage for horizontal gate-all-around (hGAA) structures are provided. The methods utilize deposition processes to selectively form air gaps on certain types of material from a stack so as to form nanowire structures with reduced parasitic capacitance and minimum device leakage at the interface that may be later utilized to form horizontal gate-all-around (hGAA) structures. Thus, horizontal gate-all-around (hGAA) structures with desired type of material and device electrical performance may be obtained, particularly for applications in horizontal gate-all-around field effect transistors (hGAA FET).

While the foregoing is directed to embodiments of the present disclosure, other and further embodiments of the disclosure may be devised without departing from the basic scope thereof, and the scope thereof is determined by the claims that follow.

The invention claimed is:

1. A method comprising:
selectively etching material from a stack disposed on a material layer located on a substrate with a plasma comprising fluorine to create one or more recesses on each of a first side of the stack and a second side of the stack opposite from the first side, wherein the material layer comprises silicon oxide, silicon nitride, or silicon on/nitride;
depositing a dielectric material on the first side of the stack and the second side of the stack, wherein the stack includes repeating pairs of a first layer and a second layer;
removing the dielectric material from the first side of the stack and the second side of the stack, wherein the dielectric material remains in the one or more recesses of the first side and the second side; and
selectively depositing a stressor layer on regions of the first side and the second side which are unprotected by the dielectric material to form one or more gaps between the stressor layer and the dielectric material remaining in the one or more recesses of the first side and the second side of the stack, and wherein each of the gaps has a dielectric constant value of about 1.

2. The method of claim 1, wherein the one or more recesses are created in each second layer.

3. The method of claim 1, wherein the dielectric material comprises silicon nitride, silicon oxide, silicon oxynitride, silicon oxycarbide, silicon carbonitride, silicon oxycarbonitride, silicon materials with dopants, nitrides, oxynitrides, or a mixture thereof.

4. The method of claim 3, wherein the dielectric material is deposited by an ALD process.

5. The method of claim 1, wherein each of the one or more gaps contains oxygen, nitrogen, and at least one of hydrogen, helium, or a mixture thereof.

6. The method of claim 1, wherein each first layer of the stack is a silicon layer and each second layer of the stack is a SiGe layer.

7. The method of claim 1, further comprising:
forming a gate structure on top of the stack.

8. The method of claim 1, wherein the stack includes at least 4 repeating pairs.

9. The method of claim 1, wherein the plasma further comprises oxygen ions and radicals.

10. The method of claim 1, wherein the plasma further comprises nitrogen ions and radicals.

11. The method of claim 1, wherein the dielectric material comprises a silicon oxynitride layer with a thickness of about 5 Å to about 50 Å.

12. A method comprising:
depositing a stack on a material layer located on a substrate in a process chamber, wherein the stack comprises repeating pairs of a first layer and a second layer, and wherein the material layer comprises silicon oxide, silicon nitride, or silicon oxynitride;
selectively etching material from the stack with a plasma comprising fluorine to create one or more recesses on each of a first side of the stack and a second side of the stack opposite from the first side;
depositing a dielectric material on the first side, the second side, and within the one or more recesses;
removing the dielectric material from each of the first side of the stack and the second side of the stack, wherein the dielectric material remains within the one or more recesses of the first side of the stack and the second side of the stack; and
selectively depositing a stressor layer on regions of the first side and the second side which are unprotected by the dielectric material to form one or more gaps between the stressor layer and the dielectric material remaining in the one or more recesses of the first side and the second side of the stack, and wherein each of the daps has a dielectric constant value of about 1.

13. The method of claim 12, wherein the substrate comprises silicon.

14. The method of claim 12, wherein the one or more recesses are created at the second layer.

15. The method of claim 12, wherein the dielectric material comprises silicon nitride, silicon oxide, silicon oxynitride, silicon oxycarbide, silicon carbonitride, silicon oxycarbonitride, silicon materials with dopants, nitrides, oxynitrides, or a mixture thereof.

16. The method of claim 12, wherein each of the one or more gaps contains oxygen, nitrogen, and at least one of hydrogen, argon, helium, or a mixture thereof.

17. The method of claim 12, wherein each first layer of the stack is a silicon layer and each second layer of the stack is a SiGe layer.

18. The method of claim 12, wherein the stack includes at least 4 repeating pairs.

19. The method of claim 12, wherein the plasma further comprises oxygen ions and radicals.

20. The method of claim 12, wherein the plasma further comprises nitrogen ions and radicals.

* * * * *

UNITED STATES PATENT AND TRADEMARK OFFICE
CERTIFICATE OF CORRECTION

PATENT NO. : 10,777,650 B2
APPLICATION NO. : 15/494981
DATED : September 15, 2020
INVENTOR(S) : Shiyu Sun et al.

It is certified that error appears in the above-identified patent and that said Letters Patent is hereby corrected as shown below:

On the Title Page

In item (54), in Column 1, in "Title", Line 1, delete "GATE ALL AROUND" and insert -- GATE-ALL-AROUND --, therefor.

In the Specification

In Column 1, Line 1, delete "GATE ALL AROUND" and insert -- GATE-ALL-AROUND --, therefor.

In Column 1, Line 49, delete "along side" and insert -- alongside --, therefor.

In Column 6, Lines 34-35, delete "gate all-around" and insert -- gate-all-around --, therefor.

In the Claims

In Column 10, Line 45, in Claim 1, delete "on/nitride;" and insert -- oxynitride; --, therefor.

In Column 11, Line 5, in Claim 5, before "helium," insert -- argon, --.

In Column 12, Line 10, in Claim 12, delete "daps" and insert -- gaps --, therefor.

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*